(12) United States Patent
Takeya et al.

(10) Patent No.: US 8,927,977 B2
(45) Date of Patent: Jan. 6, 2015

(54) ORGANIC SEMICONDUCTOR THIN FILM, ORGANIC SEMICONDUCTOR DEVICE AND ORGANIC FIELD EFFECT TRANSISTOR

(71) Applicants: JNC Corporation, Tokyo (JP); Osaka University, Osaka (JP)

(72) Inventors: Junichi Takeya, Osaka (JP); Toshihiro Okamoto, Osaka (JP); Tauto Nakanishi, Chiba (JP)

(73) Assignees: JNC Corporation, Tokyo (JP); Osaka University, Osaka (JP)

( * ) Notice: Subject to any disclaimer, the term of this patent is extended or adjusted under 35 U.S.C. 154(b) by 0 days.

(21) Appl. No.: 13/802,786

(22) Filed: Mar. 14, 2013

(65) Prior Publication Data
US 2013/0245282 A1 Sep. 19, 2013

(30) Foreign Application Priority Data
Mar. 16, 2012 (JP) ................................. 2012-060908

(51) Int. Cl.
*H01L 35/24* (2006.01)
*C07D 333/50* (2006.01)
*H01L 51/05* (2006.01)
*H01L 51/00* (2006.01)

(52) U.S. Cl.
CPC ........ *H01L 51/0074* (2013.01); *H01L 51/0071* (2013.01); *H01L 51/0073* (2013.01); *H01L 51/0541* (2013.01); *H01L 51/0545* (2013.01)
USPC ............... 257/40; 549/41; 549/456; 365/154; 361/479

(58) Field of Classification Search
CPC ....... C07D 333/50; H01L 35/24; C07K 11/06
USPC ........ 549/41, 456; 257/40; 365/154; 361/479
See application file for complete search history.

(56) References Cited

U.S. PATENT DOCUMENTS 5,347,144 A * 9/1994 Garnier et al. .................. 257/40
7,183,010 B2 * 2/2007 Jarikov .......................... 428/690
(Continued)

FOREIGN PATENT DOCUMENTS

JP 2007-197400 8/2007
JP 2008-545729 12/2008
(Continued)

OTHER PUBLICATIONS

Black, Hayden, "Expanding the Scope of Thiophene Based Semiconductors" Chapel Hill (2012).*

(Continued)

*Primary Examiner* — Andrew D Kosar
*Assistant Examiner* — Raymond Covington
(74) *Attorney, Agent, or Firm* — Jianq Chyun IP Office

(57) ABSTRACT

An organic semiconductor thin film including an organic semiconductor material that is easily synthesized, and is chemically and physically stable, and shows a high carrier mobility, an organic semiconductor device and an organic field effect transistor including the organic semiconductor thin film are provided. An organic semiconductor thin film of the invention includes a compound represented by the following formula 1:

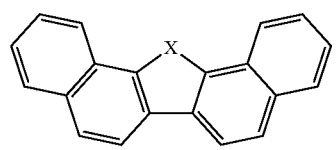

(1)

wherein, in formula (1), X is oxygen, sulfur or selenium.

3 Claims, 1 Drawing Sheet

(56) References Cited

U.S. PATENT DOCUMENTS

| | | | |
|---|---|---|---|
| 8,044,218 B2 * | 10/2011 | Yamaguchi et al. | ............ 549/41 |
| 2009/0001357 A1 | 1/2009 | Takimiya et al. | |
| 2009/0131673 A1 | 5/2009 | Tanabe et al. | |
| 2010/0065826 A1 | 3/2010 | Takimiya et al. | |
| 2010/0072887 A1 | 3/2010 | Kwong et al. | |
| 2011/0024731 A1 | 2/2011 | Takimiya et al. | |
| 2011/0248217 A1 | 10/2011 | Tanabe et al. | |

FOREIGN PATENT DOCUMENTS

| | | |
|---|---|---|
| KR | 10-0163797 | 12/1998 |
| WO | 2006077888 | 7/2006 |
| WO | 2008050726 | 5/2008 |
| WO | 2010036765 | 4/2010 |

OTHER PUBLICATIONS

John E Anthony et al, "Functionalized Pentacene: Improved Electronic Properties from Control of Solid-State Order", Journal of the American Chemical Society, Sep. 26, 2001, p. 9482-9483, vol. 123.

R. Wilputte et al. "Syntheses dans le domaine des composes cancerogenes XV(*)", Bulletin des Societes Chimiques Beiges, 1956, p. 874-898, vol. 65.

R.F. Curtis et al. "The Synthesis of 2: 3-6 :7-Dibenzodiphenylene", Journal of the Chemical Society, 1959, p. 1670-1676.

Puran K. De et al, "Sulfur Containing Stable Unsubstituted Heptacene Analogs", Organic Letters, 2012, published on Web on Nov. 30, 2011, p. 78-81, vol. 14.

Marvin L. Poutsma et al, "Thermolysis of Model Compounds for Coal. 2. Condensation and Hydrogen Transfer during Themolysis of Naphthols", The Journal of Organic Chemistry, Aug. 27, 1982, p. 3367-3377, vol. 47.

Ashraful Alam et al., "A New Method for the Synthesis of Dinaphtho [1,2-b;2',1'-d] thiophenes and Selenophenes", Heteroatom Chemistry, Apr. 9, 2007, p. 239-248, vol. 18.

* cited by examiner

ORGANIC SEMICONDUCTOR THIN FILM, ORGANIC SEMICONDUCTOR DEVICE AND ORGANIC FIELD EFFECT TRANSISTOR

CROSS REFERENCE TO RELATED APPLICATIONS

This application claims the priority benefit of Japan application serial no. 2012-060908, filed on Mar. 16, 2012. The entirety of the above-mentioned patent application is hereby incorporated by reference herein and made a part of this specification.

BACKGROUND OF THE INVENTION

1. Field of the Invention

The present invention relates to an organic semiconductor thin film, and an organic semiconductor device and an organic field effect transistor both including the organic semiconductor thin film.

2. Related Art

In recent years, an organic compound having semiconductor characteristics has attracted attention. Among the organic compounds, a polyacene compound such as pentacene and tetracene has been known as an organic semiconductor material due to a high carrier mobility thereof for many years. In addition, "carrier mobility" herein is used in a broad sense, including an electron mobility and a hole mobility.

The polyacene compound is generally unstable to light or oxidization, and therefore is a material group that is difficult to be industrially applied. Therefore, in order to improve chemical stability, a large number of compounds have been studied with regard to a compound wherein various kinds of substituents are introduced into an acene skeleton (see Non-patent literature No. 1, for example) and a compound wherein a chalcogen element such as sulfur and selenium is introduced into a part of acene skeleton, such as dibenzothienothiophene and dinaphtho-thienothiophene (see Patent literature Nos. 1 to 2, for example). The chemical stability of the compounds is improved while the high carrier mobility is maintained. However, as a molecular structure becomes more complicated, the compounds can be barely synthesized by using an expensive raw material and a reactant having a high environmental load, and through multi-step synthesis.

Thus, a variety of organic semiconductor materials have been developed so far, but synthesis of an organic semiconductor material in which both the chemical stability and the high carrier mobility are satisfied has been difficult through an industrially applicable route.

On the other hand, a chalcogen compound such as dinaphthofuran, dinaphthothiophene, dinaphthoselenophene, dianthrafuran, dianthrathiophene and dianthraselenophene can adopt a U-shaped, V-shaped or W-shaped structure depending on a substitution position of a benzene ring, and has an interesting molecular structure from a viewpoint of a degree of freedom of a molecular design. Herein, each structure is shown by taking dinaphthofuran as an example.

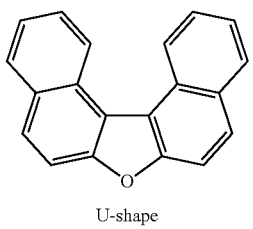

U-shape

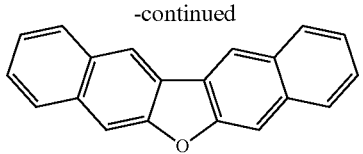

V-shape

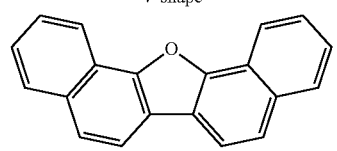

W-shape

A compound having a basic skeleton of the chalcogen compound, namely, an unsubstituted chalcogen compound has been already disclosed (see Patent literature Nos. 3 to 4 and Non-patent literature Nos. 2 to 7, for example), and the compound is excellent in chemical suability and thermal stability. However, no substantial study has been made on utilization as the organic semiconductor material. Patent literature No. 5 discloses an organic semiconductor thin film using dinaphthothiophene having a V-shaped structure (unsubstituted dinaphthothiophene) and a dinaphthothiophene derivative into which 4 to 12 substituents are introduced. However, any semiconductor characteristics are not specifically disclosed, and any compound other than dinaphthothiophene, any compound having a U-shaped structure and any compound having a W-shaped structure are not disclosed.

PATENT LITERATURE

Patent literature No. 1: WO 2006/77888 A.

Patent literature No. 2: WO 2008/50726 A.

Patent literature No. 3: JP 2008-545729 A.

Patent literature No. 4: WO 2010/36765 A.

Patent literature No. 5: JP 2007-197400 A.

NON-PATENT LITERATURE

Non-patent literature No. 1: Journal of the American Chemical Society, 2001, Vol. 123, p. 9482.

Non-patent literature No. 2: Bulletin des Societes Chimiques Belges, 1956, Vol. 65, p. 874.

Non-patent literature No. 3: Journal of the Chemical Society, 1959, p. 1670.

Non-patent literature No. 4: Journal of the Chemical Society, 1928, p. 1148.

Non-patent literature No. 5: Org Lett, 2012, Vol. 14, p. 78.

Non-patent literature No. 6: Journal of Organic Chemistry, 1982, Vol. 47, p. 3367.

Non-patent literature No. 7: Heteroatom Chemistry, 2007, Vol. 18, p. 239.

SUMMARY OF THE INVENTION

The present invention relates to an organic semiconductor thin film including a compound represented by the following formula (1):

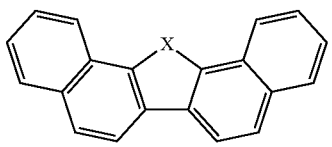

(1)

wherein, in formula (1), X is oxygen, sulfur or selenium.

REFERENCE SIGNS LIST

Figure 1A:
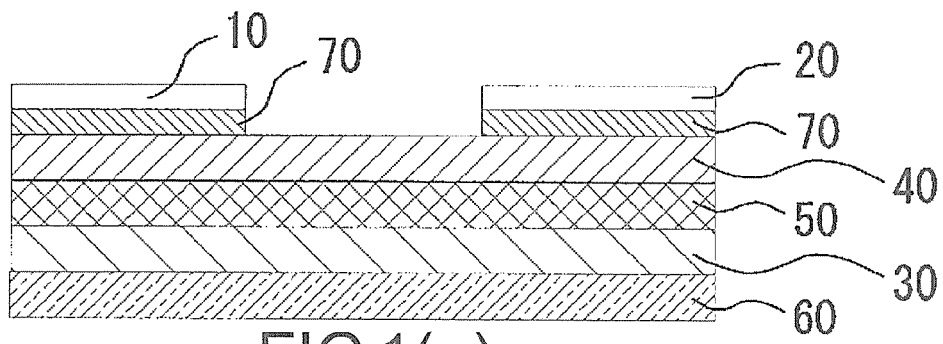
FIG. 1(a) to FIG. 1(d) are cross-sectional views of organic field effect transistors having a bottom gate-top contact type, a bottom gate-bottom contact type, a top gate-top contact type, or a top gate-bottom contact type.

10 Source electrode
20 Drain electrode
30 Gate electrode
40 Organic semiconductor layer
50 Gate insulating film
60 Substrate
70 Carrier injection layer

DETAILED DESCRIPTION OF THE INVENTION

The present inventors have found that an organic semiconductor film including an organic semiconductor material that is easily synthesized and is chemically and physically stable and shows a high carrier mobility, and an organic semiconductor device and an organic field effect transistor both including the organic semiconductor film can be provided by forming a constitution as described below, and thus have completed the invention.

[1] An organic semiconductor thin film including a compound represented by the following formula (1):

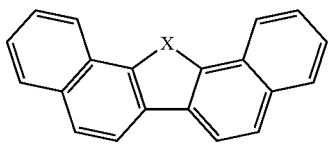

(1)

wherein, in formula (1), X is oxygen, sulfur or selenium.

[2] An organic semiconductor device including the organic semiconductor thin film according to item [1].

[3] An organic field effect transistor including the organic semiconductor thin film according to item [1].

An organic semiconductor thin film of the invention includes a specific compound that is easily synthesized, and is chemically and physically stable, and has a W-shaped structure, and therefore can be industrially manufactured, and shows a high carrier mobility than can be utilized in an organic semiconductor application by an improvement in molecular interaction utilizing a chalcogen element present in a bent site of the W-shaped structure.

Hereinafter, an organic semiconductor thin film, and an organic semiconductor device and an organic field effect transistor both including the organic semiconductor thin film according to the invention will be explained in detail.

[Organic Semiconductor Thin Film]

The organic semiconductor thin film of the invention includes a compound having a W-shaped structure in which benzene rings are stretched on both wings with a chalcogen bridging part as a bent point, represented by the following formula (1) (hereinafter, also referred to as "compound (1)"):

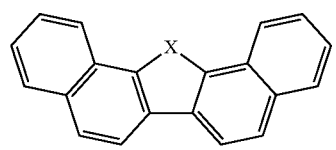

(1)

wherein, in formula (1), X is oxygen, sulfur or selenium.

Compound (1) has excellent properties as an organic semiconductor material, namely, a nigh carrier mobility, and also a high ON-OFF ratio of a drain current by a gate voltage of a transistor. Therefore, the organic semiconductor thin film can be manufactured without adversely affecting the excellent properties of compound (1).

In compound (1), molecular interaction is improved by a chalcogen element present in a bent site of molecules, and a pi electron orbital overlap is sufficiently provided between the molecules. Therefore, the organic semiconductor thin film including compound (1) shows a sufficiently high carrier mobility for practical application.

Although an optimum value of carrier mobility is different depending on an application, the carrier mobility when the organic semiconductor thin film is used in the form of the organic semiconductor device is preferably in the range of approximately 0.5 cm$^2$/V·s or more, further preferably, approximately 1.0 cm$^2$/V·s or more, particularly preferably, approximately 5.0 cm$^2$/V·s or more. Although an upper limit of the carrier mobility is not particularly limited, the upper limit is approximately 50.0 cm$^2$/V·s, for example.

Compound (1) can be synthesized or obtained according to the citation list (Non-patent literature No. 6 or 7), and can be industrially manufactured.

The organic semiconductor thin film of the invention is obtained by forming a film of compound (1) on a substrate or the like. Specific examples of methods for forming the film of compound (1) include various methods such as a coating process, a printing process and a vapor deposition process.

Specific examples of the coating process include a spin coating process, a dip coating process, a blade process, and an edge-cast process (Appl. Phys. Exp., 2. 111501 (2009)) and a gap-cast process (Adv. Mater., 23, 1626, (2011)) as invented by the present inventors. From a viewpoint of achieving the high carrier mobility, a film formation method allowing formation of a crystalline thin film having a small amount of grain boundary or a defect is desirably applied; above all, the-edge cast process or the gap-cast process allowing formation of a crystalline thin film having high alignment properties is further preferably applied.

Specific examples of the printing process include screen printing, inkjet printing, lithography, intaglio printing and letterpress printing.

Moreover, the organic semiconductor thin film may be formed on the substrate by preparing a single crystal film of compound (1) according to various methods, and by directly placing the single crystal film on the substrate. Specific examples of the method for producing single crystals include a physical vapor transport process (Ch. Kloc et al., J. Crystal Growth., Vol. 182, p. 416 (1997)) in which crystals are gradually grown by means of a tube furnace having a temperature gradient.

As the substrate on which the film of compound (1) is formed, various substrates may be exemplified. Specific examples include a glass substrate, a metal substrate such as a gold, copper or silver substrate, a crystalline silicon substrate, an amorphous silicon substrate, a triacetyl cellulose substrate, a norbornene substrate, a polyester substrate such as a polyethylene terephthalate substrate, a polyvinyl chloride substrate, a polypropylene substrate and a polyethylene substrate.

[Organic Semiconductor Device]

The organic semiconductor device of the invention includes the organic semiconductor thin film and an electrode. Specifically, the organic semiconductor device can be formed by combining the organic semiconductor thin film and any other device having semiconductor properties. Specific examples of the device having semiconductor properties include a rectifying device and a thyristor for performing switching action, namely, TRIAC and DIAC.

Moreover, the organic semiconductor device of the invention can also be used as a display device, and a display device in which all members are constituted of an organic compound is particularly useful.

Specific examples of the display device include a flexible sheet display device (electronic paper, IC card tag), a flexible liquid crystal display device and a flexible electroluminescence (EL) display device. The display devices can be prepared by forming, on an insulating substrate formed of a polymer showing flexibility, the organic semiconductor thin film of the invention and at least one layer including a constituent for allowing the film to function. The display device prepared by such a method has flexibility, and therefore can be carried by putting the device into a pocket of clothes, a purse or the like.

Specific examples of the display device also include a proper identification code response system. The proper identification code response system reacts with electromagnetic waves having a specific frequency or a specific code, and responds to electromagnetic waves including a proper identification code. The proper identification code response system is used as a reusable passenger ticket or membership card, a means of payment and settlement, a seal for identification of a parcel or merchandise, a role of a label or stamp, and a means for identifying with a high probability a document or person in company or administrative services.

The proper identification code response system has, on the glass substrate or the insulating substrate formed of the polymer showing flexibility, an aerial for receiving a signal in synchronizing with the signal, and the organic semiconductor device that operates with received electric power and sends an identification signal.

[Organic Field Effect Transistor]

Specific examples of the organic semiconductor device of the invention include the organic field effect transistor (organic FET). The organic FET of the invention includes the organic semiconductor thin film.

Figure 1B:
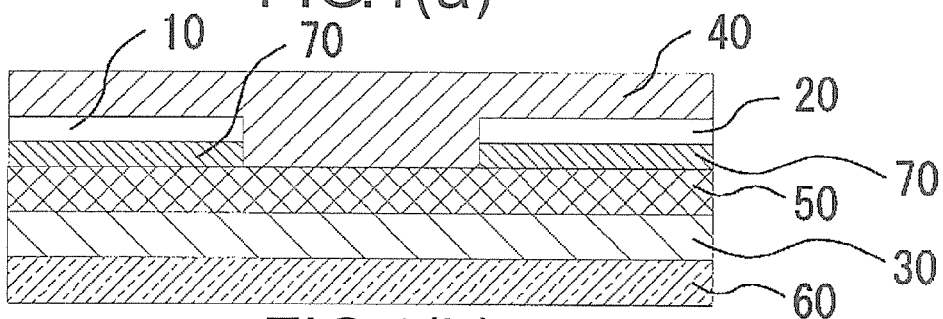
Figure 1C:
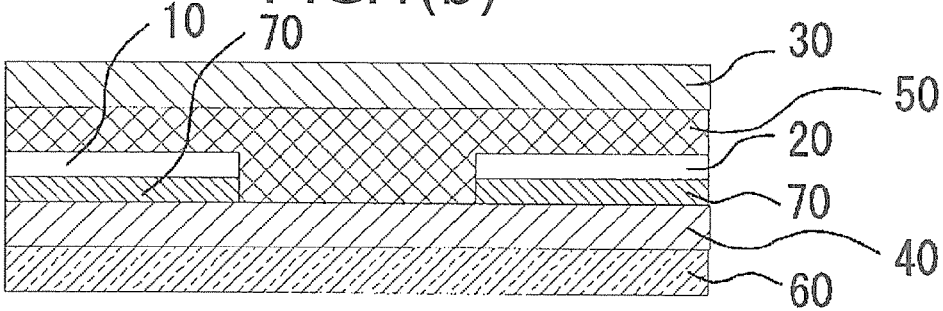
Figure 1D:
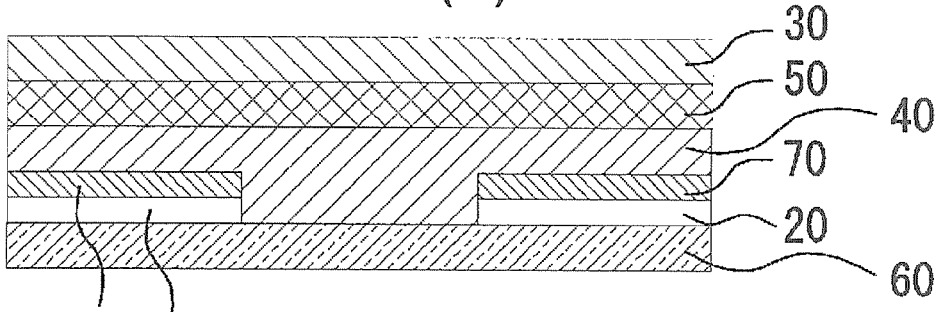

The organic FET generally has a substrate 60, a gate electrode 30, a gate insulating film 50, a source electrode 10, a drain electrode 20, a carrier injection layer 70 and an organic semiconductor layer 40 (with reference to FIG. 1(a) to FIG. 1(d)). In the organic FET of the invention, the organic semiconductor layer is formed of the organic semiconductor film of the invention.

In general, a structure of the organic FET is broadly classified into a bottom gate type structure and a top gate type structure, and each structure is further classified into a top contact type structure and a bottom contact type structure.

An embodiment in which the gate electrode, the gate insulating film and the organic semiconductor layer are formed on the substrate in the order is referred to as the bottom gate type structure, and a structure in which the organic semiconductor layer, the gate insulating film and the gate electrode are formed on the substrate in the order is referred to as the top gate type structure.

Moreover, in the organic FET, an embodiment in which the source electrode and the drain electrode are arranged on a lower part of the organic semiconductor layer (on a substrate side) is referred to as the bottom contact type structure, and an embodiment in which the source electrode and the drain electrode are arranged on an upper part of the organic semiconductor layer (on a side opposite to the substrate by interposing the organic semiconductor layer) is referred to as the top contact type structure. From a viewpoint of carrier injection between the source electrode and the organic semiconductor layer and between the drain electrode and the organic semiconductor layer, the top contact type structure is superior in organic FET characteristics to the bottom contact type structure in many cases.

FIG. 1(a) to FIG. 1(d) show cross-sectional views of organic FETs having each of a bottom gate-top contact type, a bottom gate-bottom contact type, a top gate-top contact type or a top gate-bottom contact type. However, the organic FET of the invention is not limited to the structure of the organic FET described above, but may have any other publicly known structure of the organic FET. Moreover, the organic FET of the invention may also adopt a vertical organic FET.

Specific examples of materials of the gate electrode include Al, Ta, Mo, Nb, Cu, Ag, Au, Pt, In, Ni, Nd, Cr, an inorganic material such as silicon (polysilicon, amorphous silicon, highly doped silicon), tin oxide, indium oxide and an indium tin compound (indium tin oxide: ITO), or an organic material such as a doped conductive polymer.

Specific examples of materials of the gate insulating film include an inorganic material such as $SiO_2$, $SiN$, $Al_2O_3$ and $Ta_2O_5$, or a polymer material such as polyimide and polycarbonate.

A surface of the gate insulating film and the substrate can be subjected to surface treatment using a publicly known silane coupling agent, for example, a silane coupling agent having an alkyl group, such as hexamethyldisilazane (HMDS), octadecyltrichlorosilane (OTS), decyltriethoxysilane (DTS) and octadecyltriethoxysilane (ODTS), or a silane coupling agent having a fluoroalkyl group, such as triethoxydridecafuorooctylsilane (FDTS). In the surface treatment using the silane coupling agents, the silane coupling agent spontaneously chemically bonds or adsorbs monomolecularly on the surface of the substrate such as the inorganic material, and thus a monomolecular film having an orientational order structure can be formed on the surface of the substrate.

The thus obtained monomolecular film is referred to as a self-assembled monolayer (SAM). Specific examples of methods for forming the SAM include a vapor process for heating the silane coupling agent in a vessel into a gaseous state, and allowing the silane coupling agent to chemically bond on the surface of the substrate arranged in the vessel to form the SAM, or a dipping process for directly dipping the substrate into a liquid silane coupling agent to form the SAM. If the SAM is formed by suitable surface treatment using HMDS, OTS, DTS, ODSE, FDTS or the like, an increase in a grain diameter of crystal constituting an organic FET layer, an improvement of crystallinity, an improvement of molecular orientation or the like is generally found. As a result, the carrier mobility and the ON-OFF ratio are improved, and a threshold voltage tends to decrease.

As materials of the source electrode and the drain electrode, materials of a kind same with the materials of the gate electrode can be used, and may be identical with or different from the materials of the gate electrode, or different kinds of materials may be laminated.

The carrier injection layer is arranged, as required, in the form of contact with any of the source electrode, the drain electrode and the organic semiconductor layer in order to improve carrier injection efficiency. A film of the carrier injection layer is formed by using tetrafluorotetracyanoquinodimethane (F4TCNQ), hexaazatriphenylenehexacarbonitrile (HAT-CN), molybdenum oxide (MoOx) or the like.

In the organic FET, a carrier is induced on an interface of the organic semiconductor layer on the gate insulating film by controlling voltage applied to the gate electrode, and an electric current flowing through the source electrode and the drain electrode is controlled, and thus the switching action is performed.

Moreover, in the organic FET, the carrier mobility can be determined from a drain current-gate voltage curve obtained by measuring an electric current between the source electrode and the drain electrode while changing a drain voltage and a gate voltage. Furthermore, ON-OFF action of the drain current by the gate voltage can also be observed.

The organic FET of the invention can also be used in combination with the liquid crystal display device and the electroluminescence (EL) display device.

It will be apparent to those skilled in the art that various modifications and variations can be made in the invention and specific examples provided herein without departing from the spirit or scope of the invention. Thus, it is intended that the invention covers the modifications and variations of this invention that come within the scope of any claims and their equivalents.

The following examples are for illustrative purposes only and are not intended, nor should they be interpreted to, limit the scope of the invention.

EXAMPLES

Hereinafter, the invention will be more specifically explained by way of Examples, but the invention is in no way limited to the Examples.

Example 1

Preparation of an Organic Transistor by a Single Crystal Process and Evaluation of Characteristics of the Organic Transistor Ultrasonic cleaning was applied to a silicon substrate with a thermally oxidized silicon insulating film (film thickness: 500 nm) for 5 minutes by using each of acetone and 2-propanol, and subsequently UV ozone treatment was applied to the substrate for 30 minutes. On a surface of the substrate subjected to cleaning treatment, a self-assembled monolayer (SAM) of triethoxytridecafluorooctylsilane (FDTS) was formed according to a vapor process.

Independently thereof, a single crystal film of an organic semiconductor material as shown in Table 1 was prepared according to a physical vapor transport process for allowing crystals to gradually grow by means of a tube furnace having a temperature gradient, and the resultant single crystal film was placed on a substrate. In addition, the physical vapor transport process was applied under the conditions of a tube length of 1 meter, a temperature gradient of 180 to 240° C., and using argon as a carrier gas in accordance with the method described in Journal of Crystal Growth 182 (1997), 416-427.

Subsequently, a carrier injection layer (film thickness: 1 nm) was formed by performing vacuum deposition of tetrafluorotetracyanoquinodimethane (F4TCNQ) through a metallic mask, and subsequently a source electrode (film thickness: 30 nm) and a drain electrode (film thickness: 30 nm) were formed by performing vacuum deposition of gold, and thus a bottom gate-top contact type organic FET (channel length: 500 μm, channel width: 1 mm) was prepared. For a prepared device, a carrier mobility and an ON-OFF ratio were measured using Semiconductor Parameter Analyzer (model number "Keithley 4200" made by Keithley Instruments Inc.). The results are shown in Table 1.

Example 2

Preparation of an Organic Transistor by a Single Crystal Process and Evaluation of Characteristics of the Organic Transistor A bottom gate-top contact type organic FET (channel length: 500 μm, channel width: 1 mm) was prepared in a manner similar to Example 1 except that an organic semiconductor material in Table 1 was used, and a carrier mobility and an ON-OFF ratio were measured. The results are shown in Table 1.

Example 3

Preparation of an Organic Transistor by a Single Crystal Process and Evaluation of Characteristics of the Organic Transistor A bottom gate-top contact type organic FET (channel length: 1,000 μm, channel width: 1 mm) was prepared in a manner similar to Example 1 except that an organic semiconductor material in Table 1 was used, and a self-assembled monolayer (SAM) was not formed, and a carrier mobility and an ON-OFF ratio were measured. The results are shown in Table 1.

Example 4

Preparation of an Organic FET by a Vapor Deposition Process and Evaluation of Characteristics of the Organic FET Ultrasonic cleaning was applied to a silicon substrate with a thermally oxidized silicon insulating film (film thickness: 500 nm) for 5 minutes by using each of acetone and 2-propanol, and subsequently UV ozone treatment was applied to the substrate for 30 minutes. On a surface of the substrate subjected to cleaning treatment, a SAM of decyltriethoxysilane (DTS) was formed according to a vapor process, and then vapor deposition of an organic semiconductor material shown in Table 1 was performed at a vapor deposition rate of 0.04 to 0.06 nm/s, and thus an organic semiconductor layer having a film thickness of 75 nm was formed.

Subsequently, a carrier injection layer (film thickness: 1 nm) was formed by performing vacuum deposition of tetrafluorotetracyanoquinodimethane (F4TCNQ) through a metallic mask, and subsequently a source electrode (film thickness: 30 nm) and a drain electrode (film thickness: 30 nm) were formed by performing vacuum deposition of gold, and thus a bottom gate-top contact type organic FET (channel length: 100 μm, channel width: 1 mm) was prepared. For a prepared device, a carrier mobility and an ON-OFF ratio were measured using Semiconductor Parameter Analyzer (model number "Keithley 4200" made by Keithley Instruments Inc.). The results are shown in Table 1.

Example 5

Preparation of an Organic PET by a Vapor Deposition Process and Evaluation of Characteristics of the Organic FET A bottom gate-top contact type organic FET (channel length: 500 μm, channel width: 1 mm) was prepared in a manner similar to Example 4 except that an organic semiconductor material in Table 1 was used, and a carrier mobility and an ON-OFF ratio were measured. The results are shown in Table 1.

Example 6

Preparation of an Organic FET by a Vapor Deposition Process and Evaluation of Characteristics of the Organic FET A bottom gate-top contact type organic FET (channel length: 100 μm, channel width: 1 mm) was prepared in a manner similar to Example 4 except that an organic semiconductor material in Table 1 was used, and a SAM was prepared using EDTS in place of DTS, and a carrier mobility and an ON-OFF ratio were measured. The results are shown in Table 1.

TABLE 1

| | Organic semiconductor material | Carrier mobility ($cm^2/V \cdot s$) | ON-OFF ratio | Preparation method | SAM | Channel length (μm) |
|---|---|---|---|---|---|---|
| Example 1 | 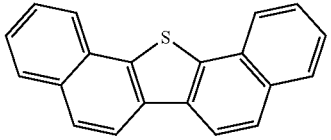 [SMILES: c1ccc2c(c1)ccc1c3ccc4ccccc4c3sc21] | 3.0 | $10^4$ | Single crystal process | FDTS | 500 |
| Example 2 | 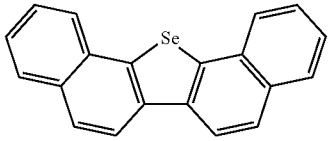 [SMILES: c1ccc2c(c1)ccc1c3ccc4ccccc4c3[se]c21] | 3.5 | $10^4$ | Single crystal process | FDTS | 500 |
| Example 3 | 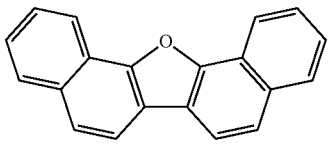 [SMILES: c1ccc2c(c1)ccc1c3ccc4ccccc4c3oc21] | 0.05 | $10^3$ | Single crystal process | None | 1000 |
| Example 4 | 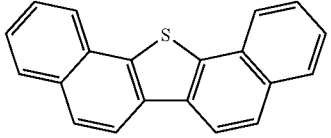 [SMILES: c1ccc2c(c1)ccc1c3ccc4ccccc4c3sc21] | $4.0 \times 10^{-4}$ | $10^2$ | Vapor deposition process | DTS | 100 |
| Example 5 | 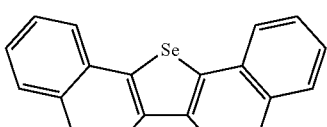 | 0.87 | $10^6$ | Vapor deposition process | DTS | 500 |
| Example 6 | 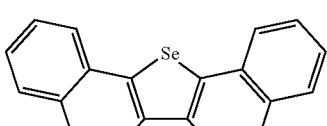 | 0.60 | $10^6$ | Vapor deposition process | FDTS | 100 |

Although the invention has been described and illustrated with a certain degree of particularity, it is understood that the disclosure has been made only by way of example, and that numerous changes in the conditions and order of steps can be resorted to by those skilled in the art without departing from the spirit and scope of the invention.

What is claimed is:

1. An organic semiconductor thin film, consisting of a compound represented by the following formula (1):

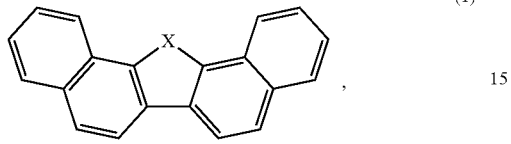

wherein, in formula (1), X is oxygen, sulfur or selenium.

2. An organic semiconductor device, comprising the organic semiconductor thin film according to claim 1.

3. An organic field effect transistor, comprising the organic semiconductor thin film according to claim 1.

* * * * *